United States Patent [19]

Lutz et al.

[11] 3,932,739

[45] Jan. 13, 1976

[54] SERIAL BINARY NUMBER AND BCD CONVERSION APPARATUS

[75] Inventors: Bruce C. Lutz, Richardson, Tex.; Delaine C. Sather, Cedar Rapids, Iowa

[73] Assignee: Rockwell International Corporation, El Segundo, Calif.

[22] Filed: Nov. 14, 1974

[21] Appl. No.: 525,422

Related U.S. Application Data

[62] Division of Ser. No. 395,817, Sept. 10, 1973.

[52] U.S. Cl. ........................... 235/155; 340/347 DD
[51] Int. Cl.² .......................................... H03K 13/24
[58] Field of Search ........ 235/154, 155; 340/347 DD

[56] References Cited
UNITED STATES PATENTS

| | | | |
|---|---|---|---|
| 2,970,765 | 2/1961 | Bird | 235/155 |
| 3,045,913 | 7/1962 | Hallden et al. | 235/155 |
| 3,500,383 | 3/1970 | Pross | 340/347 DD |
| 3,509,328 | 4/1970 | Arnstein | 235/155 |

FOREIGN PATENTS OR APPLICATIONS

| | | | |
|---|---|---|---|
| 894,986 | 4/1962 | United Kingdom | 340/347 DD |
| 869,466 | 5/1961 | United Kingdom | 340/347 DD |
| 921,330 | 3/1963 | United Kingdom | 340/347 DD |

*Primary Examiner*—Charles D. Miller
*Attorney, Agent, or Firm*—Bruce C. Lutz; Robert J. Crawford

[57] ABSTRACT

Circuitry for evaluating a serial binary number after each of several modifications with respect to given constants and further modifying the result in connection with the sign of the result obtained by the previous modification to provide serial binary to BCD conversion. Further circuitry is illustrated for converting from a BCD word to a serial binary word by adding together one or more serial binary words each representative of the value of the logic ones appearing in the BCD word.

6 Claims, 9 Drawing Figures

FIG. 1

| N=0 | $I_0 = I_{IN} - 80$ | |
|---|---|---|
| N=1 | if $I_0$ is (+)<br>$J_1 = 00000001$<br>$I_1 = I_0 - 40$ | if $I_0$ is (−)<br>$J_1 = 0$<br>$I_1 = I_0 + 40$ |
| N=2 | if $I_1$ is (+)<br>$J_2 = J_1 + 00000010$<br>$I_2 = I_1 - 20$ | if $I_0$ is (−)<br>$J_2 = J_1$<br>$I_2 = I_1 + 20$ |
| N=3 | if $I_2$ is (+)<br>$J_3 = J_2 + 00000100$<br>$I_3 = I_2 - 10$ | if $I_2$ is (−)<br>$J_3 = J_2$<br>$I_3 = I_2 + 10$ |
| N=4 | if $I_3$ is (+)<br>$J_4 = J_3 + 00001000$<br>$I_4 = I_3 - 8$ | if $I_3$ is (−)<br>$J_4 = J_3$<br>$I_4 = I_3 + 2$ |
| N=5 | if $I_4$ is (+)<br>$J_5 = J_4 + 00010000$<br>$I_5 = I_4 - 4$ | if $I_4$ is (−)<br>$J_5 = J_4$<br>$I_5 = I_4 + 4$ |
| N=6 | if $I_5$ is (+)<br>$J_6 = J_5 + 00100000$<br>$I_6 = I_5 - 2$ | if $I_5$ is (−)<br>$J_6 = J_5$<br>$I_6 = I_5 + 2$ |
| N=7 | if $I_6$ is (+)<br>$J_7 = J_6 + 01000000$<br>$I_7 = I_6 - 1$ | if $I_6$ is (−)<br>$J_7 = J_6$<br>$I_7 = I_6 + 1$ |
| N=0 | if $I_7$ is (+)<br>$J_0 = J_7 + 10000000$ | if $I_7$ is (−)<br>$J_0 = J_7$ |

| N | I | J | M |
|---|---|---|---|
| 0 | 99 − 80 = +19 |  | 10000000 |
| 1 | 19 − 40 = −21 | 00000001 | 00000001 |
| 2 | −21 + 20 = −1 | 00000001 | 00000010 |
| 3 | −1 + 10 = +9 | 00000001 | 00000100 |
| 4 | 9 − 8 = +1 | 00001001 | 00001000 |
| 5 | 1 − 4 = −3 | 00011001 | 00010000 |
| 6 | −3 + 2 = −1 | 00011000 | 00100000 |
| 7 | −1 + 1 = +0 | 00011001 | 01000000 |
| 0 |  | 10011001 | 10000000 |

FIG. 3B

| N | I | J | P |
|---|---|---|---|
| 0 | 66 − 80 = −14 |  | 00000000 |
| 1 | −14 + 40 = +26 | 00000000 | 10000001 |
| 2 | 26 − 20 = +6 | 00000001 | 00000010 |
| 3 | 6 − 10 = −4 | 00000110 | 00000100 |
| 4 | −4 + 2 = −2 | 00000110 | 00001000 |
| 5 | −2 + 4 = +2 | 00000110 | 00010000 |
| 6 | 2 − 2 = +0 | 00100110 | 00100000 |
| 7 | 0 − 1 = −1 | 01100110 | 01000000 |
| 0 |  | 01100110 | 00000000 |

FIG. 3C

| N | I | i | CODE | J |
|---|---|---|---|---|
| 0 | 10011001 |  | 1 |  |
| 1 | 01001100 | 1 | 80 | 80 |
| 2 | 00100110 | 0 | 40 | 80 |
| 3 | 00010011 | 0 | 20 | 80 |
| 4 | 00001001 | 1 | 10 | 90 |
| 5 | 00000100 | 1 | 8 | 98 |
| 6 | 00000010 | 0 | 4 | 98 |
| 7 | 00000001 | 0 | 2 | 98 |
| 0 |  | 1 | 1 | 99 |

| N | | JB | R |
|---|---|---|---|
| 0 | 99 − 80 = +19 | | |
| 1 | 19 − 40 = NO | 00000001 | 19 |
| 2 | 19 − 20 = NO | 00000001 | 19 |
| 3 | 19 − 10 = 9 | 00000001 | 19 |
| 4 | 9 − 8 = 1 | 00001001 | 9 |
| 5 | 1 − 4 = NO | 00011001 | 1 |
| 6 | 1 − 2 = NO | 00011001 | 1 |
| 7 | 1 − 1 = 0 | 00011001 | 1 |
| 0 | | 10011001 | 0 |

FIG. 6A

| N | | JB | R |
|---|---|---|---|
| 0 | 66 − 80 = NO | | |
| 1 | 66 − 40 = 26 | 00000000 | 66 |
| 2 | 26 − 20 = 6 | 00000010 | 26 |
| 3 | 6 − 10 = NO | 00000110 | 6 |
| 4 | 6 − 8 = NO | 00000110 | 6 |
| 5 | 6 − 4 = 2 | 00000110 | 6 |
| 6 | 2 − 2 = 0 | 00100110 | 2 |
| 7 | 0 − 1 = NO | 01100110 | 0 |
| 0 | | 01100110 | 0 |

FIG. 6B

SERIAL BINARY NUMBER AND BCD CONVERSION APPARATUS

THE INVENTION

This application is a division of parent application Ser. No. 395,817 filed Sept. 10, 1973.

The present invention is generally concerned with electronics and more specifically with a converter. Even more specifically, the converter in one embodiment changes serial binary words to be BCD binary coded decimal words and in another embodiment changes BCD words to serial binary words.

The present invention utilizes the circuit component and concepts outlined in my U.S. Pat. No. 3,757,261 issued on Sept. 4, 1973 and assigned to the same assignee as the present invention. For background information, it is requested that the reader consult the referenced patent. The present invention is an improvement over the prior art in performing the BCD to binary and reverse conversions using the circuitry and teachings of the referenced patent.

It is, therefore, an object of the present invention to provide improved converter circuitry.

Figure 1:
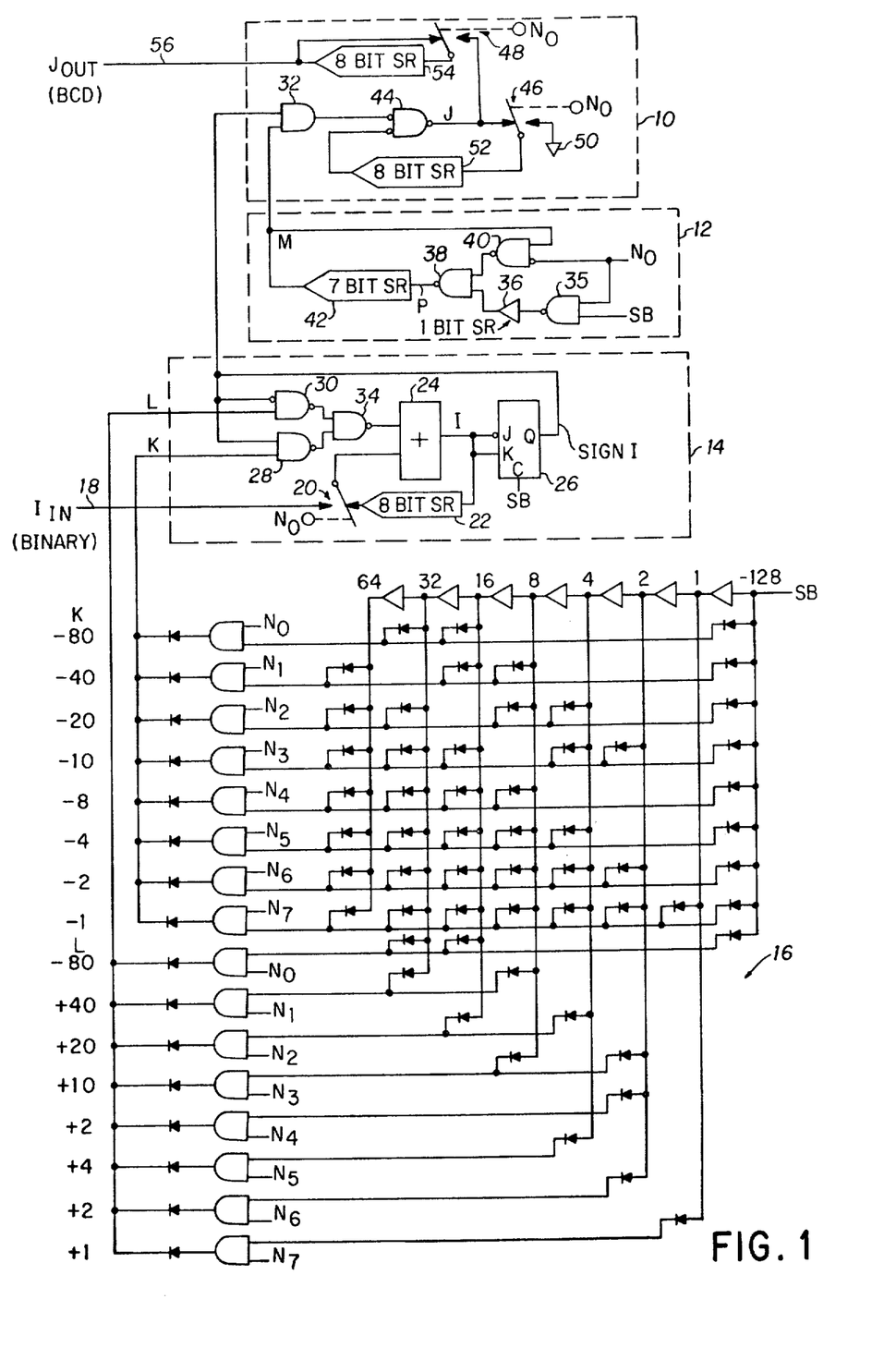
FIG. 1 is a schematic circuit diagram of one embodiment of a serial binary word to BCD word converter.

Other objects and advantages of the present invention may be ascertained from a reading of the specification and appended claims in conjunction with the drawing wherein:

FIG. 1

In FIG. 1, it will be noted that the circuit diagram is divided into three dash line blocks 10, 12 and 14, respectively, along with the remainder of the circuitry which is designated as 16. The circuitry designated as 16 is utilized to provide two constants, L and K, the value of which change with each word time of a time or word frame as illustrated.

The circuitry of block 14 is utilized to modify the input serial binary word on each step of the process in accordance with the sign of the result of the most recent previous modification and provide an output which indicates the polarity result of the previous modification.

Block 12 is utilized to provide a further set of constants the value of which decrease in numerical value during the process and which are added in block 10 upon each occurrence of a logic one being received from block 14 to produce the final converted BCD word at the end of the time frame.

In detail, it will be noted that a line 18 is used to provide a serial binary input word to one contact of a switch generally designated as 20 and which is operated in accordance with a signal $N_0$. The signal $N_0$ is logic one during word time $N_0$ and is a logic 0 from word times $N_1$ to $N_7$. The eight word times from $N_0$ to $N_7$ constitute a frame of word times. The position shown in FIG. 1 is the position of the switch with $N_0$ in the logic 0 position. Thus, the switch is in a position so it is transmitting signals from its other contact which is connected to the output of an 8-bit shift register or storge means 22 to its output which is connected to an input of a summing means, adder or summation means 24. An output of summing means 24 is connected to an input of the shift register 22 as well as to a K input of a J-K flip-flop generally designated as 26 and is also inverted and applied to the J input thereof. The Q output of J-K flip-flop 26 is designated as SIGN I and is provided to an input of a NAND gate 28 and is also inverted and supplied to an input of a NAND gate 30. Finally, it is supplied to the input of an AND gate 32 within block 10. The outputs of NAND gates 28 and 30 are supplied to inputs of a NAND gate 34 whose output is supplied to a second input of summing means 24. It may further be noted that a clock input of J-K flip-flop 26 is connected to a sync bit or synchronization bit source which provides a logic 1 signal at the time of the sign bit of the various words. The words are presented least significant bit first and most significant or sign bit last. Thus, J-K flip-flop 26 is operated at the end of each word time and stays in its given condition during the entire next word time until it is again clocked at the end thereof.

In block 12 the sync bit is applied to a NAND gate 35 which also receives an input from $N_0$ which has logic values as explained previously and as further explained in the referenced patent. The output of NAND gate 35 is supplied through a one bit shift register or storage means 36 whose output is supplied to a NAND gate 38. The $N_0$ input is also inverted and supplied to a NAND gate 40 whose output is supplied to a further input of NAND gate 38. An output of NAND gate 38 is labeled P and is supplied to a 7-bit shift register or storage means 42 whose output is designated as M and is supplied to a second input of AND gate 32 and to a second input of NAND gate 40.

An output of AND gate 32 in block 10 is supplied to an inverted input of a NAND gate 44 whose output is designated as J and is supplied to first inputs of switches 46 and 48 each of which is operated as illustrated by signal $N_0$. Again, the switches 46 and 48 are illustrated as the switches would occur in the logic zero condition of the signal $N_0$. The other contact of switch 46 is connected to ground 50. The movable contact of switch 46 is connected to an input of a 8-bit shift register or storage means 52 whose output is inverted and connected to a second input of NAND gate 44. As will be realized, the NAND gate 44 including the two inverted inputs operates identically to that of an OR gate. Further, as will be later realized, the OR gate 44 operates as an adder or summing means in the environment presented since the binary words to be added do not involve a carry operation at any stage in the time frame. The switch 48 has its output connected to a shift register or storage means 54 whose output is connected to a lead 56 and to the other contact of switch 48. The lead 56 provides the BCD output from the apparatus.

FIG. 1 also requires a source of word signals such as may be provided by a plurality of seven J-K flip-flops which are actuated by the $N_0$ word signal and which signal is passed down the plurality of flip-flops each synchronization bit time so that an output signal is provided from the Q output of each of the flip-flops to the appropriate terminals of the AND gates illustrated in circuit portion 16 for generating the K and L constants. Such a plurality may be found in FIG. 4. The gating of $N_0$ through $N_7$ each occurs for a full word time in the time frame. During a given word time such as $N_0$, the data bits are provided at the K output during the sync bit or sign bit time, which is indicative of $-128$ the fifth sign bit time which is indicative of 16 and the sixth data bit time which is indicative of 32 for the K output. For the L output, the word is identical to the K output for the $N_0$ word time. However, it is somewhat different for each of the remaining word times. The major difference is during $N_4$ wherein the output on the K generator is $-8$ and the output on the L generator is $+2$. Otherwise, the generated constants are the same with different sign bits.

Figure 2:
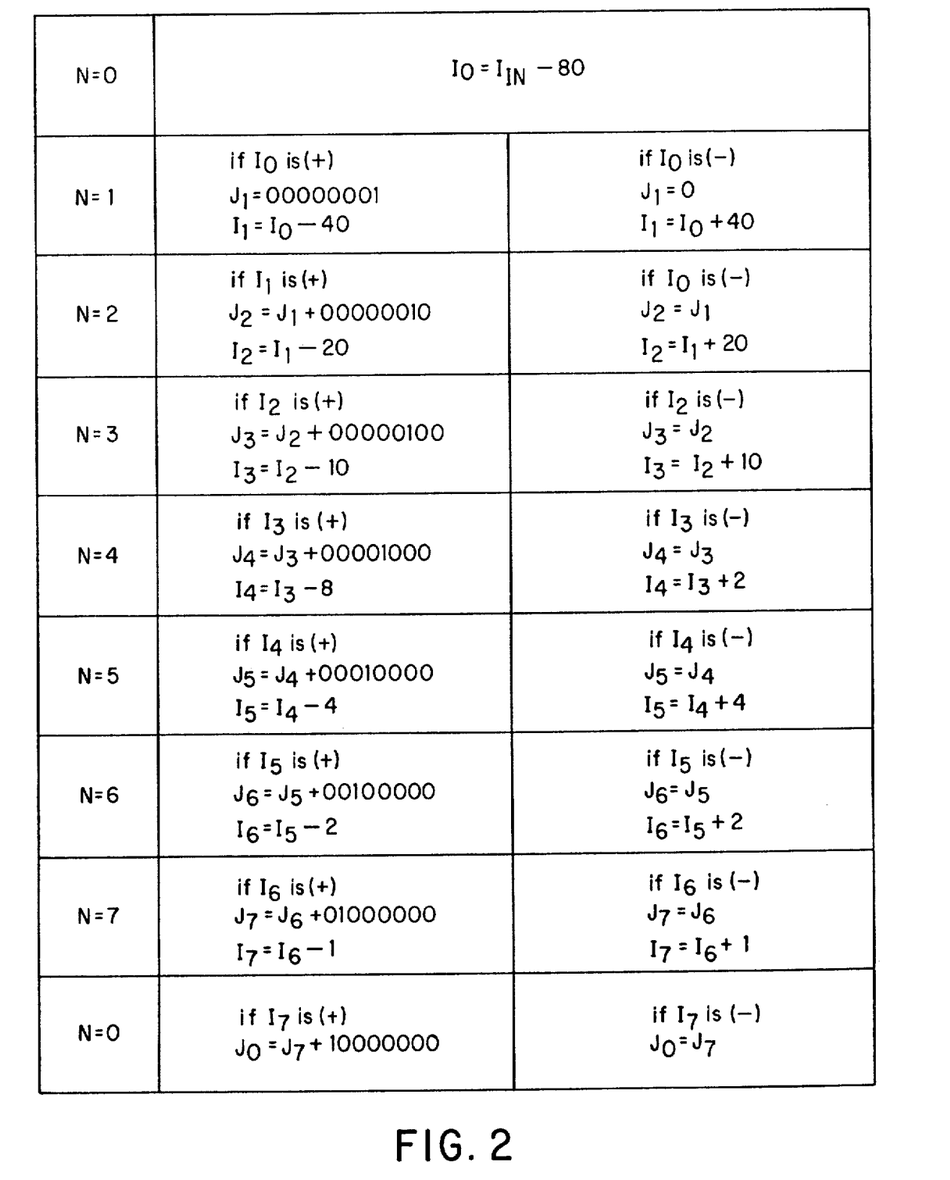
FIG. 2 is a chart illustrating the decision choices by the gating circuitry of FIG. 1 and the results of those decisions for each word time step of a conversion frame process.
Figure 3A:
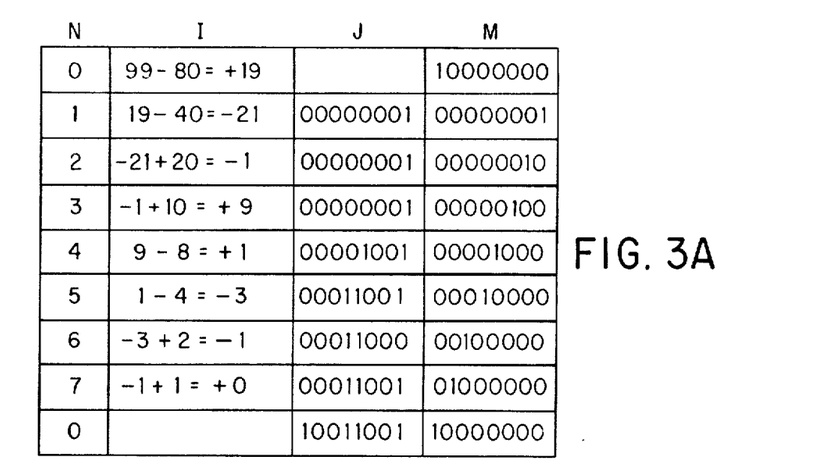
FIGS. 3A, 3B, 3C illustrate in chart form the numerical values produced within the circuitry as it proceeds toward solving the conversion process for given numbers.
Figure 3B:
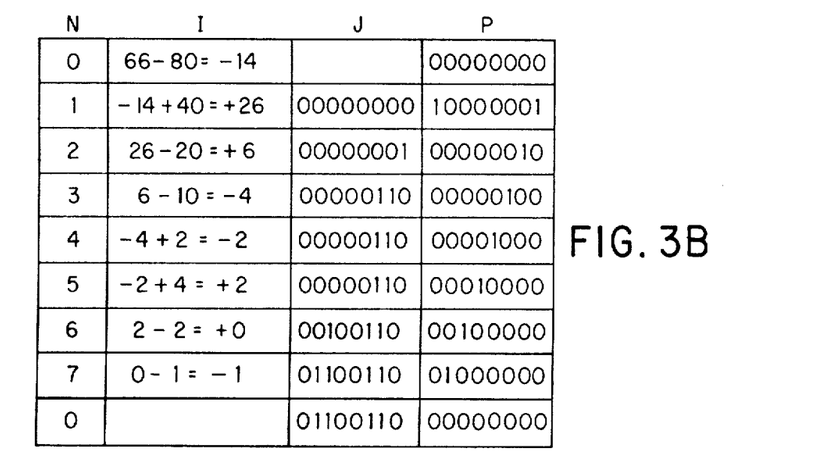

FIGS. 2, 3A AND 3B

In the first column of FIG. 2 the various word times are designated from $N_0$ to $N_7$ and back again to $N_0$. The operations are outlined in the next two columns with a single column used for the $N_0$ word time since the input word is combined with $-80$ regardless of whether the constants from L or K are used. However, from this point forward in the process the resultant word is combined with a K or L constant depending upon the sign of the previous word I. This previous word I is given designators of $I_0$ through $I_7$ to correspond with the word time. Thus, using the example of FIG. 3A, it will be noted that if an input of a serial binary number representative of 99 is presented on lead 18, this would be combined with $-80$ to produce a resultant of $+19$. Since the result of the operation in word time $N_0$ is a positive number, the second column is used of FIG. 2 for word time $N_1$ and the word $I_0$ which appears at the output of summation circuit 24 is combined with the K constant for that time period and 40 is subtracted from 19. The result is a $-21$. Thus, during word time $N_2$ the last column of FIG. 2 is utilized and it will be noted that the resultant output from summation 24 is now added to the appropriate constant from the L input. In this case, it would be a constant of 20 producing a resultant value for $I_3$ of $-1$. This resultant is still negative and thus the last column is used for word time $N_3$. Thus, the constant from L is again used and the $-1$ is combined with a $+10$ to produce a $+9$. During word time $N_4$, the operation is switched back to the second column of FIG. 2 since the resultant I in word time 3 has a positive sign. Thus, the resultant $+9$ is now combined with a $-8$ to produce a resultant of $+1$. The remaining steps of FIG. 3A may be ascertained from observation of the rules set forth in FIG. 2. An additional column J in FIG. 3A illustrates the output obtained at the output of OR gate 44 and illustrates the build-up of the BCD number which at word time $N_0$ is transmitted through switch 48 to shift register 54 wherein this BCD number is circulated once each word time for the entire following frame time. Such a practice is consistent with the practices in the referenced patent. The M column in FIG. 3A illustrates the words generated by block 12 in FIG. 1 for producing the words to be added during the time of the word following the word in which the sign of the output summation means 24 is positive, thereby producing a gating logic one output from J-K flip-flop 26.

FIG. 3B is a further chart illustrating the operation of the circuit when a word such as 66 is inputted to the converter of FIG. 1 to produce a BCD output. The column P illustrates the word appearing at the output of NAND gate 38 so that a comparison can be made between FIGS. 3A and 3B to illustrate the changes incurred in bit position after being transmitted through the shift register 42.

Figure 3C:
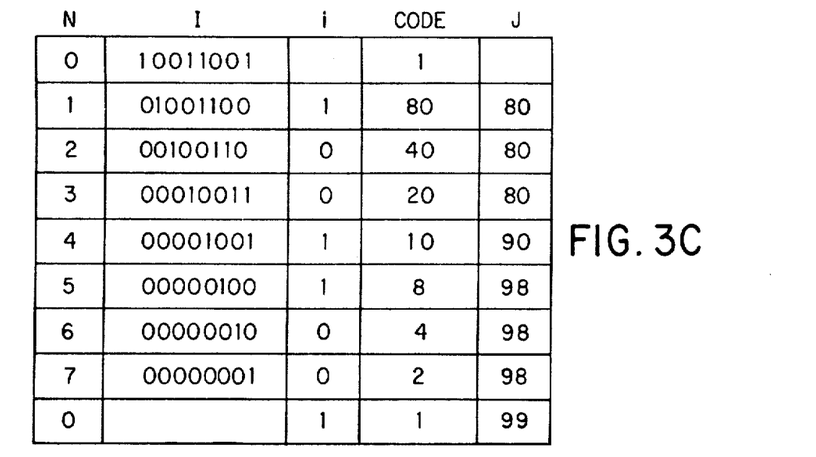

The above overall view of the circuit of FIG. 1 as related to the appropriate portions of FIGS. 2 and 3, will now be reviewed in operational detail. The converter of FIG. 1 utilizes a serial binary word input on line 18 and provides a serial BCD word output on line 56. Each of these serial words is of an equal number of bits and is presented least significant bit first and most significant bit last as previously mentioned. All of the words in the converter operate in synchronism by means of a synchronization bit SB from a clock which is generated during the most significant bit time of each word.

The conversion process requires a complete time frame where a frame is defined as a number of word times equal to the number of bits in the word. The start of each new time frame (and the end of the preceding frame) is synchronized by means of a synchronization word ($N_0$) from the clock. The synchronization word $N_0$ is generated for one full word time each frame.

In the serial binary words, the sign bit is the eighth or last bit of the word and it indicates a weighted value of $-128$ when it appears as a logic one. All of the other bits (1 through 7, or first through next to last) of the words have positive weighted values (e.g. $+1$, $+2$, $+4$, $+8$, $+16$, $+32$, and $+64$.)

The input word on line 18 must always be positive and limited to a value of 99 since the 4-bits required for each BCD digit uses the 8-bit capacity of the present embodiment. As will be realized, the circuitry may be expanded for larger or smaller BCD numbers and serial binary numbers.

Referring specifically to block 14, it will be noted that if $I_{IN}$ is inserted on line 18 at word time $N_0$, it may be added to either K or L since during time $N_0$ each of these is $-80$. As will be realized, the NAND gates 30 and 28 are exclusively operated in accordance with the sign of the previous operation. Thus, the sign of the previous operation and the resultant setting of J-K flip-flop 26 has no effect on the first step. From then on, as may be ascertained from FIGS. 2 and 3, the gates 28 or 30 operate in accordance with the logic value of the sign of the word produced at the output of summing means 24 in the previous operation. Thus, in the example of 3A, for word time $N_1$ the word produced by summing means 24 would be a positive 19 and the positive sign bit at the time of the sync bit would produce a logic one at the Q output of flip-flop 26 on the trailing edge of the sync bit SB. This logic one output would actuate the NAND gate 28 so that a logic zero would be produced at the output for every logic one input at the K input. This in turn would be inverted by NAND gate 34 to produce a logic one output to be applied to the summing means 24 instead of its usual logic zero output. The result of the summation operation in word time $N_1$ as will be noted from FIG. 3A is a minus word having a value of $-21$ and thus the J-K flip-flop 26 will be altered to provide a logic zero output during the entire word time $N_2$. Thus, the NAND gate 30 will be actuated to supply thereto the word having the binary equivalent 20 on the L input line during word time $N_2$. The device will continue producing outputs on the sign I lead during the remainder of the process. As will be noted, this sign 1 lead is one of the two inputs to AND gate 32. Referring now to the block 12, it will be noted that during word time $N_0$, the logic 1 of $N_0$ as inverted and applied to NAND gate 40 will prevent the passage of any signals and thus effectively clear the shift register 42. However, the appearance of the sync bit at the end of word time $N_0$ will produce a logic 0 output which is delayed in shift register 36 until word time $N_1$ and this will again be inverted to produce the logic 1 at the beginning of the $N_1$ word as may be observed from the P column in FIG. 3B. Seven bits later, this bit has traversed the shift register 42 and is presented back at the input during the sync bit time or most significant bit time as may also be observed from column P in FIG. 3B. As will be noted from column M in FIG. 3A, the output from block 12 is a continuously decreasing numerical value number from word times $N_1$ through $N_0$ with only a single logic 1 appearing in each instance. In effect, the logic 1 moves toward the least significant position one position each word time. The SIGN I lead is used to gate this word M through to OR gate 44 each word time. The circuit of block 10 is cleared to contain all 0's in shift register 52 during word time $N_0$ by the movement of switch 46 to provide a grounded input. From then on, the occurrence of a logic 1 at the output of J–K flip-flop 26 will pass the M input from block 12 through the OR gate 44 and into shift register 52. The various M inputs are such that when added to previous M inputs there will be no carrying and thus an ordinary OR gate or double inverted NAND gate as shown may be used to provide the summing operation. However, a circuit similar to that of 24 could have been used to provide this operation. At the end of the conversion operation, the switch 48 is activated and the word appearing on the J lead is transferred to shift register 54 where it is circulated once each word time for the following time frame and thus can be picked up at the output lead 56.

Figure 4:
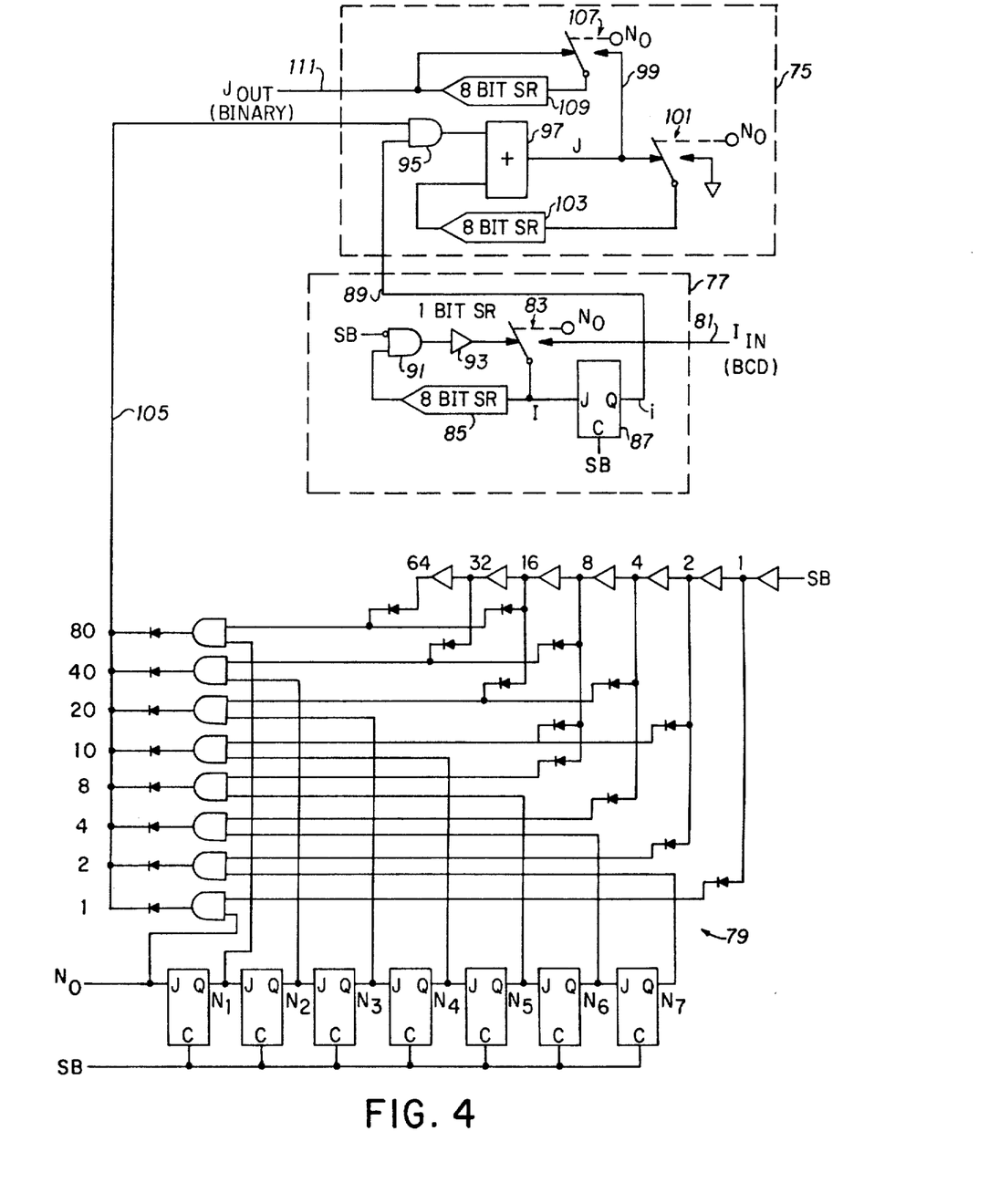
FIG. 4 is a schematic circuit diagram of one embodiment of the invention for performing serial BCD word to binary serial word conversion.

FIGS. 3C AND 4

Serial BCD to Binary Word Converter

The circuit of FIG. 4 is divided into two dash line blocks 75 and 77 with the remaining circuitry generally designated as 79. The circuitry of 79 generates the code presented in both FIG. 4 and FIG. 3C ranging from 80 to 1 in consecutive word times from $N_1$ to $N_0$. This is accomplished in much the same manner as the constant code generators of FIG. 1. In addition, it will be noted that the connection of the J–K flip-flops for actuating the specific AND gate being used during a specific word time is also illustrated and this illustration may also be used as an aid in understanding FIG. 1.

The serial BCD number to serial binary word converter is much the same as previously described in connection with the circuit of FIG. 1 in requiring positive two digit 4 binary bit BCD numbers and thus positive converted serial binary numbers.

The circuitry of 77 is utilized to produce the output I which merely checks the inputted BCD number bit-by-bit and provides a logic 1 output upon the detection of each logic 1 bit in the BCD number from most significant bit to least significant bit. This is accomplished by using 9 bits of storage or shift register for circulation and eliminating the last detected bit upon each circulation. Thus, through the use of the 9-bit storage, the next most significant bit for each word time detection becomes the most significant bit on the following word time and thus occurs at the time of the synchronization bit. Therefore, the J–K flip-flop is set each time in accordance with the logic value of each succeeding bit in the input word. It may be assumed that the input word is 99 in BCD code as shown in FIG. 3C and is applied on lead 81. This word is applied through an $N_0$ operated switch designated as 83 and is applied to the input of an 8-bit shift register 85. At the end of word time $N_0$ a J–K flip-flop 87 samples the right hand or most significant bit of the BCD word and in the example of FIG. 3C, detects that it is a logic 1. Thus, a logic 1 appears at the output of the J–K flip-flop 87 on the I lead 89 for the word time $N_1$. The presence of the synchronization bit at word time $N_0$ as applied to an AND gate 91 has no effect on the present input word but does eliminate any possible 1's in the previous input word. During word time $N_1$, the word stored in shift register 85 is passed through AND gate 91 and delayed in 1-bit shift register 93 before being returned to shift register 85. At the sync bit time of word time $N_1$ it will be observed from column I in FIG. 3C that the most significant bit is a logic 0 thereby changing J–K flip-flop 87 during word time $N_2$ to have a logic 0 output on lead 89. The logic 0 output will also occur during word time $N_3$ but will be changed due to the logic 1 appearing at the sync bit time of word time $N_3$ to have a logic 1 output during word time $N_4$.

The circuitry in block 75 utilizes an AND gate 95 to take the output from the code generator 79 and the signal on lead 89 and pass the coded input to a summing means 97. The summation is supplied as a J output on lead 99 to an input of a switch 101 which is grounded during word time $N_0$ to clear a shift register 103. Thus, during word time $N_1$ there is no input from shift register 103 and using the example of FIG. 3C the input will be a binary 80 on lead 105 from the generator 79 which is gated through AND gate 95 by the logic I on lead 89. Since logic 0's appear on lead 89 during word times $N_2$ and $N_3$, the codes 40 and 20, respectively, are prevented from being supplied through AND gate 95 from lead 105. However, during word time $N_4$ the code constant 10 is allowed to pass and is added to the word 80 which has circulated through shift register three times. It is added to produce a total binary word of 90 at the end of word time $N_4$. This process continues as may be ascertained from the example of FIG. 3C until the end of word time $N_7$. At the start of word time $N_0$ a switch 107 is operated by the signal of $N_0$ and the final summed output of 99 from summing means 97 is passed into a shift register 109. At the end of time $N_0$ switch 107 is again reverted to the position shown and the word 99 is then circulated in the shift register where it may be outputted on lead 111 at any time during the next time frame.

Figure 5:
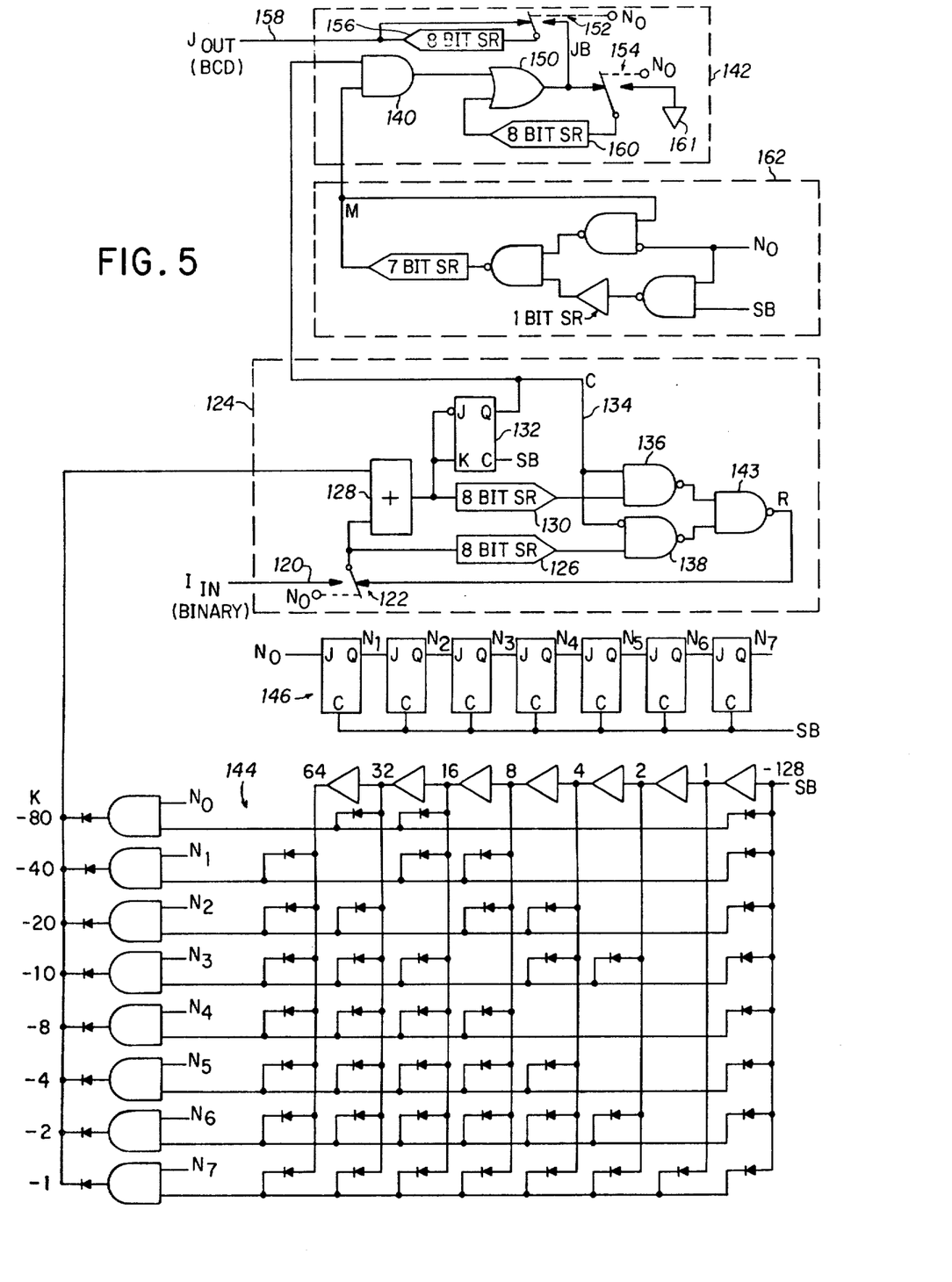
FIG. 5 is a schematic circuit diagram of a second embodiment of a serial binary word to BCD word converter.

FIG. 5

Serial Binary to BCD Converter

In FIG. 5 a binary input is supplied on a lead 120 to a $N_0$ operated switch generally designated as 122 in a dash line block 124. During word time $N_0$ this input word is supplied to a first 8 bit shift register 126 and also to an input of a summing circuit of adding means 128. An output of the summing means 128 is passed to a second shift register 130, as well as being supplied to a K input of a J-K flip-flop generally designated as 132. The output of summing means 128 is also inverted and supplied to a J input of J-K flip-flop 132. A sync bit is supplied to a clock input of J-K flip-flop 132 and the Q output is connected to a line 134 which is supplied to a first input of a NAND gate 136 and is inverted and supplied to a first input of a NAND gate 138, as well as being supplied to an input of an AND gate 140 in a dash line block 142. NAND gate 136 receives a second input from shift register 130 while NAND gate 138 receives a second input from shift register 126. The outputs of NAND gates 136 and 138 are supplied to inputs of a NAND gate 143 whose output is supplied to a second contact of switch 122 as shown.

A K generator is generally illustrated as 144 and operates in substantially the same manner as the K generator of FIG. 1. In addition, a clocking device for the K generator is shown generally as 146 comprising a plurality of J-K flip-flops. These would be connected in substantially the same manner as more clearly illustrated in FIG. 4.

An output of AND gate 140 is supplied as a first input to an OR gate 150 whose output is supplied to a first contact of a first switch generally designated as 152 and to a first contact of a second switch generally designated as 154. A shift register generally designated as 156 has its input connected to the movable contact output of switch 152 and its output connected to a second contact of switch 152, as well as being supplied to the J output of the apparatus further labeled or designated as 158. The output or movable contact of switch 154 is connected to an input of a shift register 160, whose output is connected to a second input of OR gate 150. The second contact of switch 154 is connected to ground 161.

A final dash line block 162 operates to produce an M signal in a manner identical to that of block 12 of FIG. 1 and thus no further designators will be used for this block.

Figure 6A:
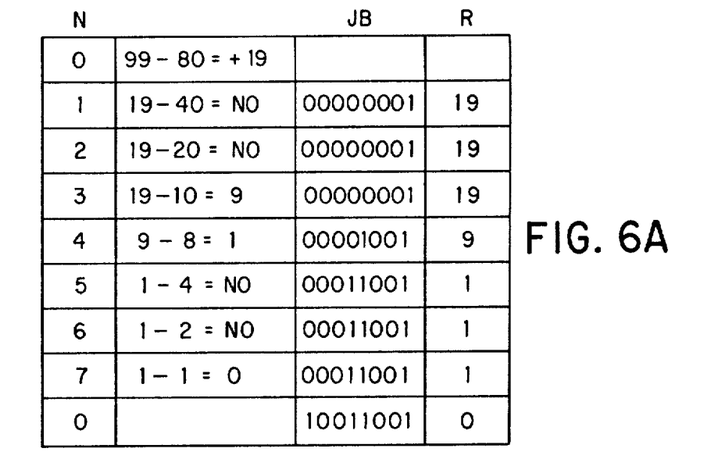
FIGS. 6A, 6B illustrate in chart form the conversion process of FIG. 5.
Figure 6B:
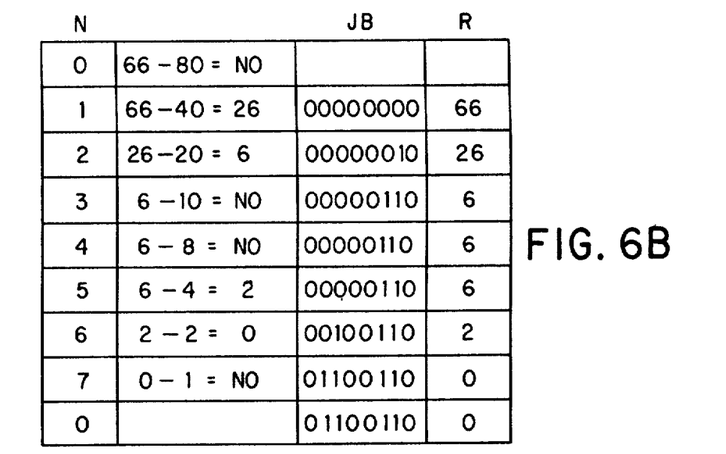

FIGS. 6A and 6B are comparable to FIGS. 3A and 3B in illustrating the conversion process. The circuitry of block 124 in each word time attempts to add the incoming negative K constant to the word being supplied from switch 122 thereby resulting in a subtraction of the absolute value of the number. During word time $N_0$ this would be the input word applied from line 120. During each of the subsequent word times, this would be the word supplied from the R line output of NAND gate 143. If the result of the addition in summing means 128 is a negative number, a logic 1 will appear during the sync bit time at the output of summing means 128 and operate the J-K flip-flop to produce a logic zero output on line 134. This operation will gate the word from shift register 126 through gate 138 and 140 to produce the R output which is recirculated back to the input of summing means 128 and returns the same number to shift register 126. However, if the result of the addition of the negative K constant and the number being received from 122 is a positive number, J-K flip-flop 132 provides a logic 1 output and, thus, prevents the output of shift register 126 from being supplied through the NAND gates and instead allows the word in shift register 130 to be transmitted through NAND gates 136 and 143 to appear as output R.

Observing the contents of the table of FIG. 6A, it will be noted that if the input word is 99, at the end of word time $N_0$ shift register 130 will contain a serial binary number equivalent to +19 while shift register 126 will contain a similar +99. Since the last bit from the summing means 128 is a logic zero thereby indicating a positive number, the J-K flip-flop 132 provides a logic 1 output on lead 134 and shifts the +19 through to the output of NAND gate 143 and thus produces a binary 19 which is supplied bit-by-bit during word time $N_1$ to the shift register 126 and to the summing means 128. The constant during word time $N_1$ is −40 and this is added to +19 in the summing means 128 and placed bit-by-bit into shift register 130. During the sync bit time it will be determined by the J-K flip-flop 132 that the sign bit is a logic 1 thereby indicating a negative number and thus the J-K flip-flop will provide a logic zero output and recirculate the binary +19 from shift register 126 to the R output and back to the input of shift register 126 and summing means 128 during word time $N_2$. Following the chart it will be observed that a negative result will again be obtained during word time $N_2$ so that the binary 19 will again be recirculated during the $N_3$ word time. However, during word time $N_3$ the addition of a +19 to a −10 from the K constant generator will produce a positive 9 and thus during word time 4 the word R will now be 9 instead of 1. The following subtraction process in word time 4 will produce a result of +1. Using the reasoning above the rest of the chart for FIG. 6A can be analyzed. As will be realized the word "NO" is used in FIGS. 6A and 6B to indicate a negative result whereby the number in shift register 126 is recirculated rather than using the number in register 130.

The chart of FIG. 6B, which commences with an input word of 66 to be converted to BCD, uses the same reasoning in that the first subtraction is negative and thus the input word is recirculated from the shift register 126 for use again during word time $N_1$.

The outputs from the J-K flip-flop 132 operate to activate GATE 140 during the times that there is a logic 1 output from the J-K flip-flop thereby indicating that the result of the summation is a positive number. Thus, for the problem of FIG. 6A, the circuitry in block 142 will add the M input during word times $N_1$, $N_4$, $N_5$, and also during $N_0$ at the end of the conversion process. As before the OR gate 150 provides a satisfactory summing action since the numbers involved preclude the possibility of any carry operations.

From the above description of operation, it will be noted that the embodiment of a serial binary number to BCD converter operates in a somewhat simpler fashion than does the circuit of FIG. 1. Basically, the circuit compares the input binary number with a series of constants. On each comparison where the binary number is larger than the stated constant for that word time, the constant is subtracted and a one is inserted in the apparatus output stage to indicate the number being operated upon has been reduced in value. When the comparison is such that the constant is larger in absolute magnitude than the remaining number being operated upon, no subtraction occurs but rather the number is compared with succeeding constants until the comparison is again positive. At this time a further logic 1 is inserted in the number to be provided as the converted BCD number.

While the present circuit is able to operate with one less code generator, it requires an additional shift register. Thus, the particular circuit to be used will depend at least in part, as to whether or not code generators must be built for other similar circuits and what code generation is used for these circuits before determining which circuit would be most expedient for a particular application.

However, as will be realized by those skilled in the art, both circuits, FIG. 1 and FIG. 5, illustrate the same basic principle of converting a serial binary number to a BCD number through the process of examining the input number in successive steps as compared to a series of constants and inserting logic 1's in the number to be provided at the output upon the occurrence of prescribed conditions in the comparisons.

As may be ascertained from the above described embodiments, the BCD answer as well as its use as an input as shown in FIG. 4 is presented least significant bit first and basically has a code from left to right of (1, 2, 4, 8, 10, 20, 40, and 80). However, other codes may be handled by the circuitry illustrated by changing the values of the constants which are added to or subtracted from I during the appropriate word times. Specifically referring to FIG. 1, it will be noted for example that a weighted code of (1, 2, 4, 2, 10, 20, 40, 20) may be handled by changing the chart of FIG. 2 to read $I_0 = I_N - 20$ and changing the presentation during word time $N_4$ from $I_4 = I_3 - 8$ to $I_4 = I_3 - 2$ and in the third column changing $I_4 = I_3 + 2$ to $I_4 = I_3 + 8$. For FIG. 1, the last referenced weighted code can be handled by changing the K generator to output −20, −40, −20, −10, −2, −4, −2, and −1 and the L generator to output −20, +40, +20, +10, +8, +4, +2, +1. For FIG. 5 the K generator would also be changed to output −20, −40, −20, −10, −2, −4, −2, −1.

Further, it will be realized from the evaluation of the above discussion that different lengths of binary and BCD words may be converted than that shown.

While I have illustrated only a single embodiment for conversion of BCD to binary and two embodiments of binary to BCD, I wish to be limited only by the scope of the appended claims and not by the specific circuitry illustrated and described.

I claim:
1. Apparatus for converting a serial binary number word to a BCD number word in a time frame equivalent to a word time multiplied by the number of bits in a word comprising, in combination:
   first means for supplying a serial binary number word of eight bits;
   second means for generating first and second series of constants having the values −80, −40, −20, −10, −8, −4, −2, −1, and −80, +40, +20, +10, +2, +4, +2, +1, respectively, one of each series of which is generated each word time in the frame;
   third means, connected to said first and second means and including output means, for modifying the word to be converted each word time of a frame by adding the value of the first series corresponding to the word in the frame if the sign of the previous word as modified was positive and by adding the value of the second series corresponding to the word in the frame if the sign of the previous word as modified was negative and supplying as an output a logic value indicative of the sign of the word as modified each word time;
   fourth means for generating words having a logic 1 in positions of consecutively decreasing value as the converter time frame of words proceeds; and
   fifth means, connected to receive signals from said third and fourth means and including output means, for providing as an output a summation of all words received from said fourth means during word times that the output of said third means is a given logic value.

2. Apparatus as claimed in claim 1 wherein said third means comprises:
   gating means including first and second inputs for receiving the first and second series of constants from said second means and further including third input means;
   summation means and storage means for initially receiving the serial binary number supplied by said first means and comparing this number with a constant received from said second means during said first word time of the time frame and subsequently summing the constant received from said second means with a stored value of the previous summation; and
   means for detecting the sign of the word resulting from each summation by said summation means and presenting a signal indicative of the detected sign to said third input of said gating means during the following word time.

3. Apparatus as claimed in claim 2 wherein:
   said third means includes a J-K flip-flop for providing the sign detection;
   said gating means includes NAND gates which pass the constants from said first series if the sign of the previous word is positive and pass the second series of constants if the sign of the previous word is negative; and
   said fifth means includes storage means for providing the converted BCD number word output during the entire time frame following the conversion time frame.

4. Apparatus for providing a conversion from serial binary number words to BCD (Binary Coded Decimal) number words in a time frame of N words where each word comprises N bits comprising, in combination:
   first means for supplying an input binary serial number word;
   second means for supplying a series of constants having the values of −80, +40, +20, +10, +2, +4, +2, +1, and supplied in consecutive order one for each word time in the time frame;
   third means for supplying the constants of −80, −40, −20, −10, −8, −4, −2, −1, and supplied in consecutive order one for each word time in the time frame;
   first summing means including first and second inputs and an output;
   first shift register means connected to said output of said summing means for storing the summing words received from said summing means and providing a delayed output indicative thereof;
   switch means connected to said first means and to said output of said first shift register means for receiving the word from said first means in one word time of a frame and then receiving the words from said first shift register means for the remaining word times of a frame, said switching means providing as an output a signal to said first input of said first summing means;
   J-K flip-flop means connected to said output of said first summing means for providing a logic one output upon the detection of a positive binary summation number occurring in a previous word time from said summation means;

gating means including first, second, and third inputs, said first and second inputs being connected to said second and third means for generating constants, respectively, and said third input being connected to receive output signals from said J-K flip-flop;

fourth means for generating words each containing a single logic one and consecutively decreasing in value for each word of a time frame;

AND gate means connected to said fourth means for receiving the words therefrom and further connected to said third input means of said gating means for receiving output signals from said J-K flip-flop means, said AND gate providing an output signal;

second summing means including a first input connected to receive signals from said AND gate means, a second input and an output;

switch means connected to said output of said second summing means and providing an output for only N-1 words of a time frame;

second shift register means connected to said output of said second switch means for storing words received therefrom and supplying a delayed version of these words to said second input of said second summing means; and means connected to said output of said second summing means for providing as an apparatus output, for final summation, words produced by said second summing means at the end of a time frame for the following time frame.

5. Serial binary number word to binary coded decimal (BCD) number word conversion apparatus comprising, in combination:

generator means for supplying a series of constants, one each word time for a frame of N word times wherein N is equal to the number of bits in the BCD word, the value of the constants being equal to the corresponding bit position of a BCD word;

input means for supplying an input serial binary number word to be converted;

comparison means, connected to said generator means for receiving words therefrom and including a further input and first and second output means, said comparison means providing as an output signal at said first output means any serial binary words supplied to said further input when the serial binary word is of a lesser absolute value than the constant received at the word time of comparison and simultaneously supplying a given binary logic value signal at said second output means, said comparison means providing as an output signal at said first output means, when the serial binary word supplied to said further input is of a greater absolute value than the constant received at the word time of the comparison, the difference in absolute magnitudes and simultaneously supplying at said second output means a binary logic signal of a logic value opposite said given logic value;

said comparison means comprising, in combination;

summing means connected to receive said series of constants at a first input and having a second input connected to said further input of said comparison means, said summing means including an output means, J-K flip-flop means connected to receive signals from said output means of said summing means during the most significant bit time of each word time and having an output thereof connected to said second output means of said comparison means, gating means including first, second, and third input means wherein said first input means thereof is connected to said second output means of said comparison means and said output means of said gating means is connected to said first output means of said comparison means, first shift register means connected between said output means of said summing means and said second input means of said gating means, second shift register means connected between said first input means of said comparison means and said third input means of said gating means; and switch means connected to said input means, said first output means and said further input for supplying said serial binary word to be converted to said further input of said comparison means during the first word time of a frame time and returning output words from said first output means of said comparison means during the remaining word times of the frame time.

6. Apparatus as claimed in claim 5 comprising in addition:

assembly means for assembling logic bits representative of given logic value input signals during each word time of a frame time and outputting the assembled word during the frame time following assembly; and means connected between said second output means of said comparison means and said assembly means for providing said binary logic value signals thereto.

* * * * *